(12) United States Patent
Chong et al.

(10) Patent No.: US 9,772,656 B2
(45) Date of Patent: Sep. 26, 2017

(54) FLEXIBLE DISPLAY DEVICE

(71) Applicant: SAMSUNG DISPLAY CO., LTD., Yongin, Gyeonggi-Do (KR)

(72) Inventors: Jong Ho Chong, Hwaseong-si (KR); Dong-Wook Choi, Hwaseong-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 38 days.

(21) Appl. No.: 14/859,732

(22) Filed: Sep. 21, 2015

(65) Prior Publication Data

US 2016/0209877 A1 Jul. 21, 2016

(30) Foreign Application Priority Data

Jan. 15, 2015 (KR) .................. 10-2015-0007617

(51) Int. Cl.
| | |
|---|---|
| *G06F 1/16* | (2006.01) |
| *H01L 27/12* | (2006.01) |
| *G09G 3/3225* | (2016.01) |
| *H01L 51/00* | (2006.01) |

(52) U.S. Cl.
CPC .......... *G06F 1/1652* (2013.01); *G09G 3/3225* (2013.01); *H01L 27/1255* (2013.01); *H01L 51/0097* (2013.01); *G09G 2380/02* (2013.01)

(58) Field of Classification Search
CPC ............... G06F 1/1652; H01L 27/1255; H01L 51/0097; G09G 3/3225; G09G 2380/02
See application file for complete search history.

(56) References Cited

U.S. PATENT DOCUMENTS

| | | | |
|---|---|---|---|
| 2010/0059753 A1* | 3/2010 | Andrews | ........... H01L 29/78603 257/59 |
| 2016/0035812 A1* | 2/2016 | Kwon | ................. H01L 27/3276 257/40 |

FOREIGN PATENT DOCUMENTS

| | | |
|---|---|---|
| KR | 10-2011-0048640 A | 5/2011 |
| KR | 10-1067587 B1 | 9/2011 |
| KR | 10-2013-0098024 A | 9/2013 |
| KR | 10-2014-0028391 A | 3/2014 |

OTHER PUBLICATIONS

Paik, et al., "Electric Resistance Property of a Conducting Shape Memory Polyurethane Actuator" Key Engineering Materials vol. 297-300 (2005) pp. 1539-1544.

Kohlmeyer, et al., "Remote, Local, and Chemical Programming of Healable Multishape Memory Polymer Nanocomposites" American Chemical Society Nano Letters vol. 12 (2012) pp. 2757-2762.

* cited by examiner

*Primary Examiner* — Charles Hicks
(74) *Attorney, Agent, or Firm* — Lee & Morse, P.C.

(57) ABSTRACT

A flexible display device includes a flexible display panel to display an image, a support panel including a shape memory polymer layer and a driver to control a shape of the shape memory polymer layer, and a flexible PCB connecting the driver to a driving circuit board. The support panel is coupled to a rear side of the display panel.

19 Claims, 8 Drawing Sheets

FLEXIBLE DISPLAY DEVICE

CROSS-REFERENCE TO RELATED APPLICATION

Korean Patent Application No. 10-2015-0007617, filed on Jan. 15, 2015, and entitled "Flexible Display Device," is incorporated by reference herein in its entirety.

BACKGROUND

1. Field

One or more embodiments described herein relate to a flexible display device.

2. Description of the Related Art

A flexible display device has been developed to include a display unit formed on a flexible substrate. The flexible display device may repetitively perform folding and unfolding operations. The flexible display device may folded when unused and unfolded to view information on a screen.

The flexible display device requires a space at an outer side (tensile side) of the folding area in order to repetitively perform the folding operation. That is, the flexible display device having a thickness causes a difference in length of an arc between an inner side and an outer side, due to a difference in radius between an inner side (compression side) to be folded and an outer side. The difference in length of the arc forms a space at the outer side of the folding area.

When the flexible display device is folded and used, a space formed outside the folding area causes inconvenience in use while irritating a user's hand. In addition, while a pressing force of a user's finger, a touch pen, or the like is applied, durability of the folding area may deteriorate.

SUMMARY

In accordance with one or more embodiments, a flexible display device includes a flexible display panel to display an image, a support panel including a shape memory polymer layer and a driver to control a shape of the shape memory polymer layer, the support panel coupled to a rear side of the display panel, and a flexible PCB connecting the driver to a driving circuit board.

The driver may include a switching thin film transistor to control a column part of the shape memory polymer layer, the shape memory polymer layer is connected to the electrode storage plate and the common electrode which are connected to the drain electrode of the switching thin film transistor through the column part, and a shape of the shape memory polymer layer is adjusted based on a voltage corresponding to a difference between a voltage transmitted to the electrode storage plate from the switching thin film transistor and a voltage supplied from the common electrode.

The driver may include a storage capacitor, the switching thin film transistor may be connected to a gate line and a data line to transmit a data voltage from the data line to the column part through the electrode storage plate based on a switching voltage input to the gate line, and the storage capacitor may be connected to the electrode storage plate through a first storage plate and is connected to the common electrode through a second storage plate to store the voltage corresponding to the difference between the voltage from the switching thin film transistor and the voltage supplied from the common electrode, the voltage to be supplied to the column part.

The support panel may include a first substrate including the driver, the electrode storage plate, and the storage capacitor, and a second substrate may be attached to the display panel and cover the shape memory polymer layer on the driver, the electrode storage plate, and the storage capacitor. The shape memory polymer layer may include an inner plate attached to the second substrate, and an outer plate may be spaced apart from an outside of the inner plate and connected to the column part.

In the support panel, the shape memory polymer layer is in a folding area of the display panel. The shape memory polymer layer may include a plurality of column parts, the column parts of the support panel may maintain substantially a same height while the display panel is unfolded, and a height the column parts at a center of the folding area may be less than a height of the column parts away from the center of the folding area while the display panel is folded.

The shape memory polymer layer may include a plurality of column parts, and the column parts may be spaced apart from each other in a direction crossing a length direction of a folding area and extend in the length direction. The flexible display device may include planar support parts attached to the rear side the display panel, the planar support parts adjacent respective sides of the folding area in substantially a same plane.

The shape memory polymer layer may include a plurality of column parts, a plurality of data lines may extend in one direction of the display panel from one side of the column parts, the data lines substantially parallel to each other, and a plurality of gate lines may extend in a direction crossing the data lines from one side of the column parts, the gate lines substantially parallel to each other. The flexible PCB may include a first PCB including a first driving integrated circuit connected to the data line to apply a data voltage, and a second PCB may include a second driving integrated circuit connected to the gate line to apply a switching voltage.

In accordance with one or more other embodiments, a display device includes a control circuit; a first support surface; a second support surface; and a support panel in folding area between the first support surface and the second support surface, the control circuit to generate signals to change a shape of the support panel to have a first shape in a folded state and to have a second shape in an unfolded state, wherein the first shape is a non-planar shape and the support panel has an outer surface substantially coplanar with the first and second support surfaces when in the second shape. The control circuit may generate the signals based on forces applied to the support panel in the folded and unfolded states or a detected state or orientation of the display device.

The support panel may include one or more supports that are to expand and contract based on the signals generated by the control circuit. The one or more supports may expand and contract in a direction that crosses a display screen. The support panel may include a plurality of supports, and the signals generated by the control circuit may cause the supports to have substantially a same size in the unfolded state and to have different sizes in the folded state. The supports may be included in a shape memory polymer layer. The non-planar shape may be a bent or curved shape.

In accordance with one or more other embodiments, an apparatus includes an interface coupled to a support panel of a display device, and a controller coupled to the interface, the controller to generate signals to change a shape of the support panel to have a first shape in a folded state of the display device and to have a second shape in an unfolded state of the display device, wherein the first shape is a non-planar shape and the support panel has an outer surface substantially coplanar with the first and second support surfaces when in the second shape. The controller may generate the signals based on forces applied to the support panel in the folded and unfolded states.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
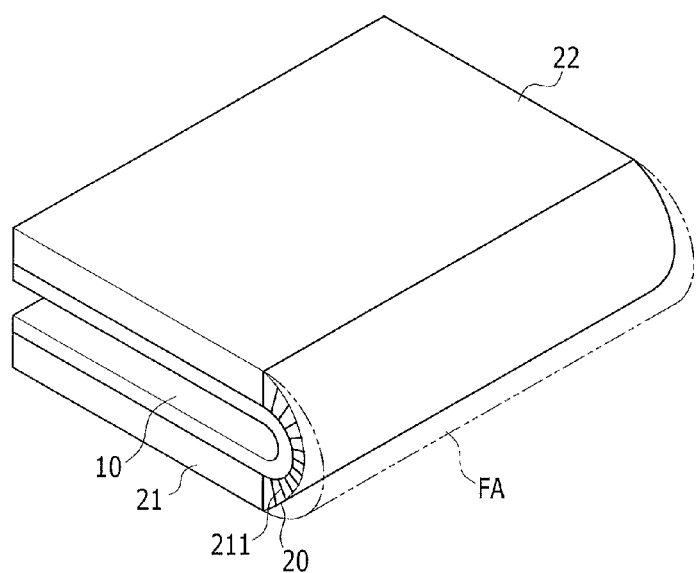
FIG. 1 illustrates an embodiment of a flexible display device in a folded state.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

It will be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element such as a layer, film, region, or substrate is referred to as being "on" another element, it can be directly on the other element or intervening elements may also be present. Further, in the specification, the word "on" means positioning on or below the object portion, but does not essentially mean positioning on the upper side of the object portion based on a gravity direction.

Figure 2:
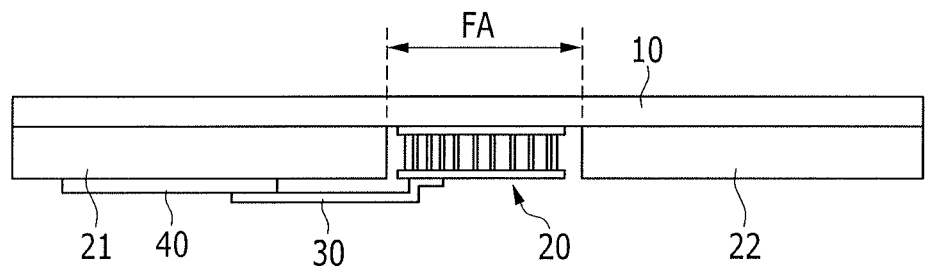
FIG. 2 illustrates an embodiment of the flexible display device in an unfolded state.

FIG. 1 illustrates an embodiment of a flexible display device in a folded state, and FIG. 2 illustrates a side view of the flexible display device in an unfolded state. Referring to FIGS. 1 and 2, the flexible display device includes a support panel 20 and a flexible printed circuit board (PCB) 30. The support panel 20 is coupled to a rear side of a flexible display panel 10, and the PCB 30 is connected to the support panel 20 and a driving circuit board 40. In another embodiment, the PCB 30 may be included in an interior surface of the display device, so that it is not exposed at the outer surface of the display device.

The display panel 10 includes a plurality of pixels arranged in a matrix form to display an image. The display panel 10 may be, for example, an organic light emitting panel, a liquid crystal display panel, and an electrophoretic display panel. The display panel 10 is formed on a flexible substrate in order to have flexible characteristics, e.g., in order to allow the display panel to bend, fold, or curve. For example, the flexible substrate may include a plastic film. The pixels of the display panel 10 are arranged on the flexible substrate.

The display panel 10 includes a folding area FA to allow the display panel 10 to fold and unfold. Since the support panel 20 is provided on the rear side of the display panel 10, the support panel 20 compensates for changes in radius of the rear side of the display panel 10 in an unfolded state. For example, while the thickness of the support panel 20 changes in the folding area FA in the unfolded state, the display panel 10 is supported from the rear side of the folding area FA.

The support panel 20 includes a shape memory polymer layer 201 (see, e.g., FIG. 6) and column parts 211 (see. e.g., FIG. 4) in the shape memory polymer layer 201. The column parts 211 are formed of a shape memory polymer. When the flexible display device is unfolded, the folding area FA of the display panel 10 is supported from the rear side of the folding area FA based on a height change (e.g., a thickness change) of the column parts 211 depending on the position of the support panel 20.

When the flexible display device is folded, the column parts 211 of the support panel 20 are extended or compressed and the shape of the support panel 20 changes to correspond to a curvature of the folded display panel 10. During folding, the support panel 20 receives a compressive force from the inner side and receives tension from the outer side. When this occurs, a control signal is applied to the column parts 211 and heights of the column parts 211 are adjusted according to the control signal.

Planar support parts 21 and 22 are provided at respective sides of the support panel 20 and are attached to a rear plane of the display panel 10. These parts form a plane in the unfolded state to support the display panel 10. Accordingly, the display panel 10 may be stably supported by the support panel 20 and the planar support parts 21 and 22 in the unfolded state, e.g., the support parts 21 and 22 and the support panel 20 may provide a substantially continuous planar surface to support the display panel 10.

Figure 3:
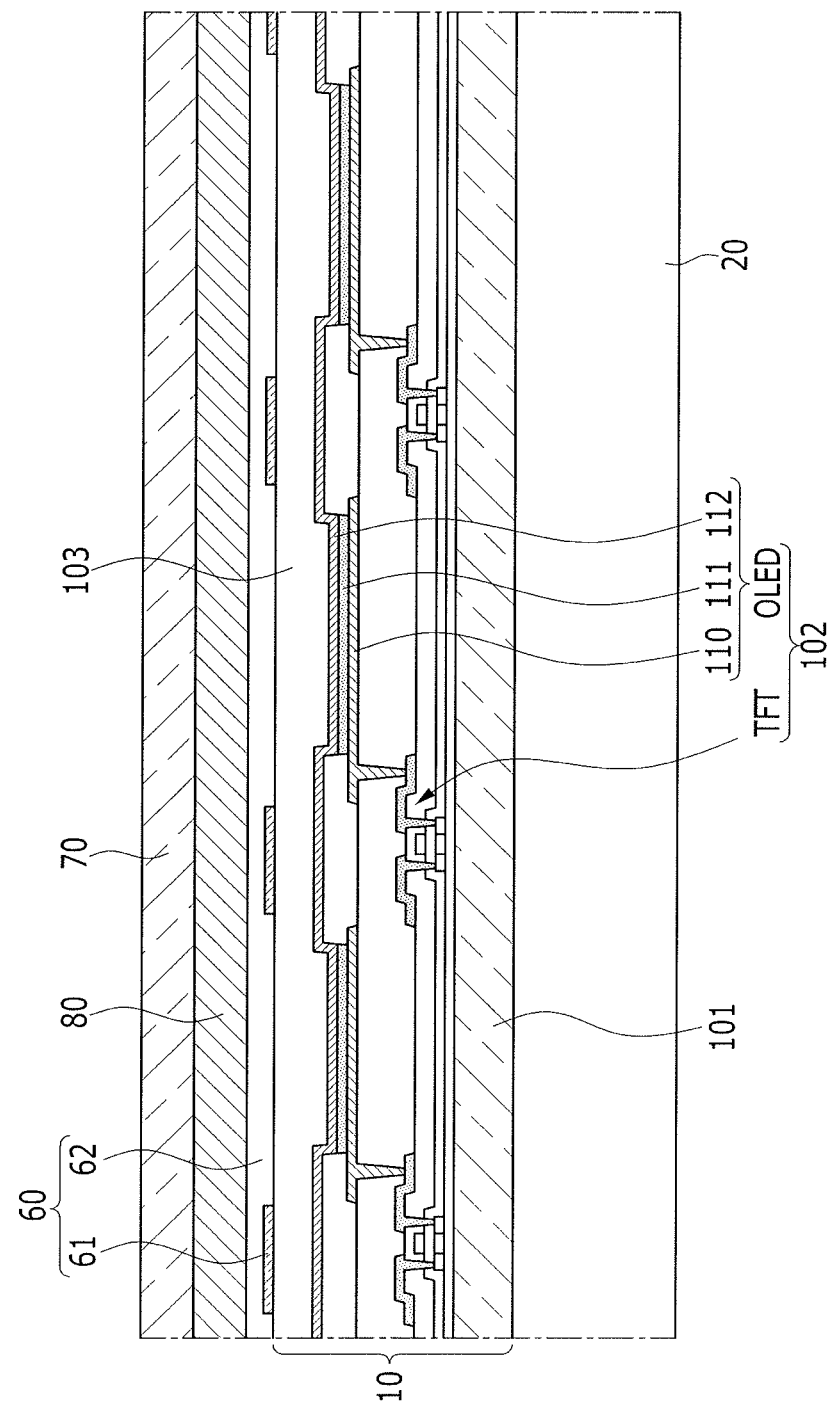
FIG. 3 illustrates an embodiment of a display panel of the flexible display device.

FIG. 3 illustrates an embodiment of an organic light emitting panel applied to the flexible display device of FIG. 1. Referring to FIG. 3, the flexible display device includes a touch screen panel 60 attached on to an upper side of the display panel 10, and a window substrate 70 covering the touch screen panel 60. The support panel 20 is attached onto the rear surface of the display panel 10.

The display panel 10 includes a flexible substrate 101, a plurality of thin film transistors (TFTs), and a plurality of organic light emitting diodes (OLEDs) on the flexible substrate 101. The display panel 10 also includes a sealing part 103 covering the OLEDs and a touch screen panel 60, an optical film part 80, and a window substrate 70 on the sealing part 103. The TFTs and OLEDs are included in the display unit 102.

Each TFT corresponds to a pixel circuit, which also includes a storage capacitor. The OLED includes a pixel electrode 110 connected to the TFT, an organic emission layer 111 formed on the pixel electrode 110, and a common electrode 112 formed in all or a portion of an entire display area on the organic emission layer 111.

The pixel electrode 110 may serve as a hole injection electrode (an anode) and the common electrode 112 may serve as an electron injection electrode (a cathode). Holes from the anode and electrons from the cathode combine in the organic emission layer 111 to generate excitons. Light is emitted based on energy generated when the exciton drops from an excited state to a ground state.

The sealing part 103 seals and protects the OLEDs from moisture and oxygen. The sealing part 103 may include, for example, a thin film encapsulation formed by laminating at least one inorganic layer and at least one organic layer.

The touch screen panel 60 includes a plurality of sensing electrodes 61 and an insulating layer 62 covering the sensing electrodes 61. The touch screen panel 60 performs a touch sensing function. The optical film part 80 suppresses reflection of external light in order to prevent contrast of a screen from deteriorating. The positions of the touch screen panel 60 and the optical film part 80 may be changed in another embodiment. The window substrate 70 protects features below the window substrate 70 from external impact, scratches, or the like.

Figure 4:
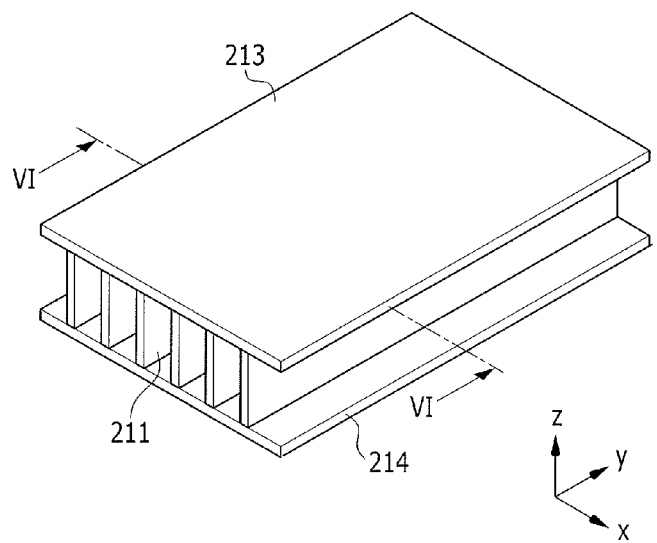
FIG. 4 illustrates an embodiment of a shape memory polymer layer.
Figure 5:
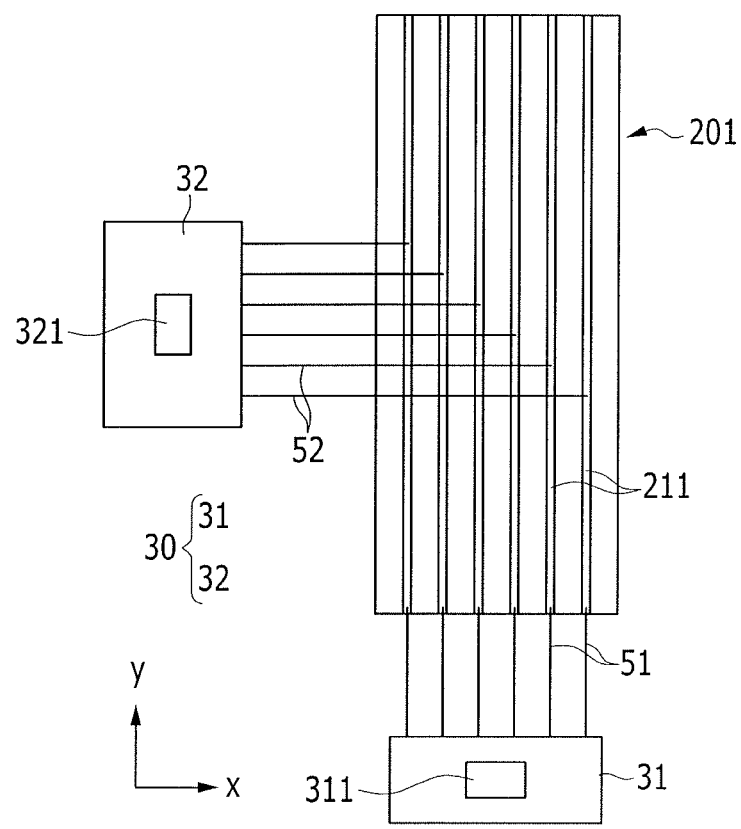
FIG. 5 illustrates an embodiment of a flexible printed board.

FIG. 4 illustrates an embodiment of a shape memory polymer layer 201 for the support panel 20. FIG. 5 illustrates a state in which a flexible printed board is connected to a column part of the support panel of FIG. 4. Referring to FIGS. 4 and 5, the shape memory polymer layer 201 of the support panel 20 includes column parts 211 which are spaced from each other in a first direction (e.g., x-axial direction) crossing a second direction (e.g., y-axial direction) of the folding area FA. The column parts 211 extend in the second direction.

Referring to FIGS. 2, 4, and 5, one side of the flexible PCB 30 is connected to the column parts 211 of the support panel 20 in the folding area FA through data lines 51 and gate lines 52. The other side of the flexible PCB 30 is connected to one or more driving circuits of the driving circuit board 40.

The data lines 51 are connected to first sides of the column parts 211 extending in the second direction (y-axial direction) of the display panel 10 in the folding area FA. The gate lines 52 are connected to the column parts 211 in the first direction (x-axial direction) crossing the data lines 51. Accordingly, the data lines 51 and the gate lines 52 select the column parts 211 according to a position of the folding area FA. For example, while the shapes (e.g., heights or sizes) of the column parts 211 at a position where the data lines 51 and the gate lines 52 meet each other are modified according to a voltage signal applied to the selected data line(s) 51 and gate line(s) 52, the rear side of the folding area FA of the display panel 10 may be supported in the folded state.

The flexible PCB 30 includes a first PCB 31 connected to the data lines 51 and a second PCB 32 connected to the gate lines 52. First and second driving integrated circuits 311 and 321 are mounted on the first and second PCBs 31 and 32, for example, by a chip-on-film type mounting.

Based on a control from the driving circuit board 40, the first and second driving integrated circuits 311 and 321 output a control signal to respectively apply a data voltage and a switching voltage to one or more of the data lines 51 and one or more of the gate lines 52 through the first and second PCBs 31 and 32.

When the data voltage is applied to one data line 51 of the data lines 51, the data voltage is applied to the column part 211 in the y-axial direction corresponding to the data line 51. When the switching voltage is applied to one gate line 52 of the gate lines 52, the voltage signal is applied to the column part 211 in the x-axial direction corresponding to the gate line 52. Accordingly, the shape (e.g., height or size) of the column part 211 where the data line 51 and the gate line 52 cross each other is adjusted. The support panel 20 supports the display panel 10 in the folding area FA by the column parts 211 having controlled shapes (e.g., heights or sizes) and the shape memory polymer layer 201.

The display panel 10 is connected to the driving circuit board 40 as the flexible PCB 30. The driving circuit board 40 may be formed as a flexible PCB.

Figure 6:
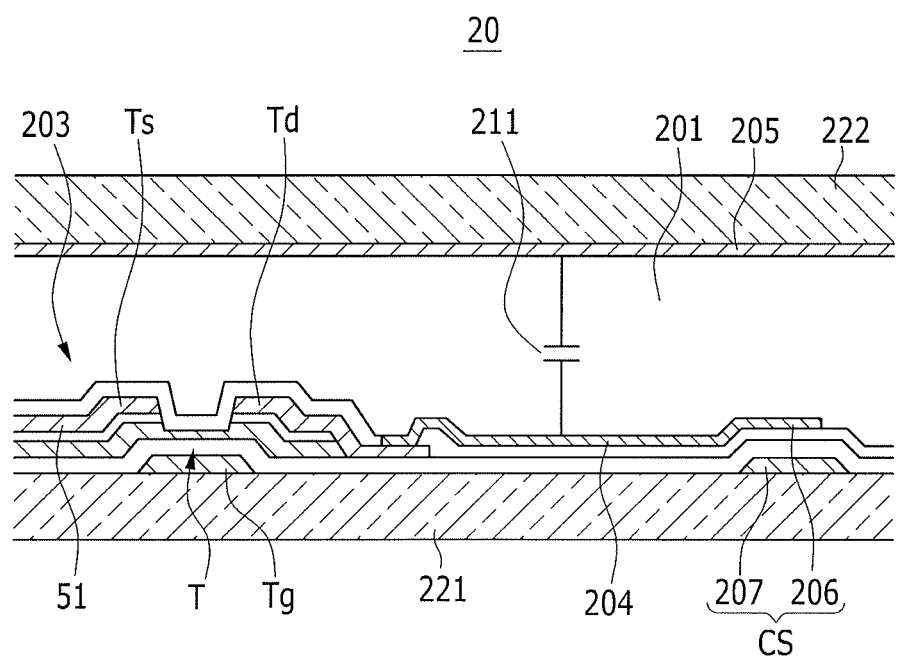
FIG. 6 illustrates a view of a support panel along section line VI-VI in FIG. 5.
Figure 7:
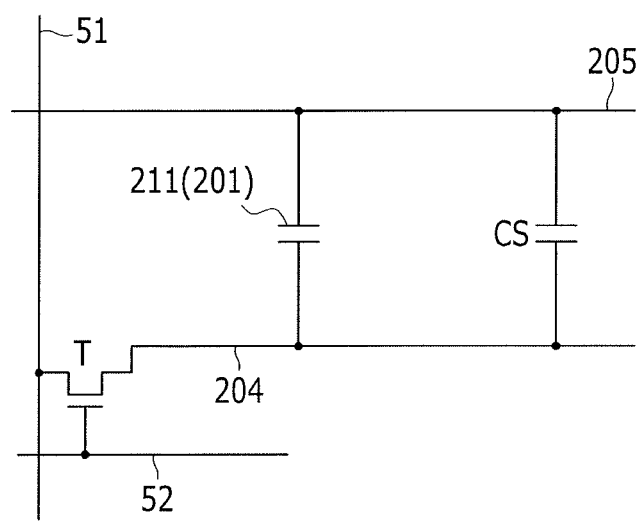
FIG. 7 illustrates an embodiment of a circuit for controlling the support panel.

FIG. 6 is a cross-sectional view of one embodiment of the support panel in FIG. 5 along line VI-VI. FIG. 7 illustrates an embodiment of a circuit for controlling the column parts of the support panel in FIG. 6.

Referring to FIGS. 6 and 7, the support panel 20 includes a shape memory polymer layer 201 including column parts 211 of the shape memory polymer and a driver 203 for controlling the column parts 211. The driver 203 includes a switching thin film transistor T for controlling the column parts 211 and a storage capacitor Cs. The switching thin film transistor T includes a source electrode Ts, a drain electrode Td, and a gate electrode Tg. For convenience, in FIGS. 6 and 7, each of the column parts 211 is illustrated as a capacitor.

Each column part 211 of the shape memory polymer layer 201 is connected between an electrode storage plate 204 and a common electrode 205. The electrode storage plate 204 is connected to the drain electrode Td of the switching thin film transistor T. The common electrode 205 may be connected to the second PCB 32 like the gate line 52 extending in an x-axial direction.

Therefore, the shapes of the column parts 211 of the shape memory polymer layer 201 are changed based on a voltage corresponding to the difference between a voltage transmitted from the drain electrode Td of the switching thin film transistor T to the electrode storage plate 204 and a voltage supplied from the common electrode 205. Since the electrode storage plate 204 and the common electrode 205 are at the rear side of the display panel 10, the electrode storage plate 204 and the common electrode 205 may be made, for example, of transparent ITO or an opaque material.

The switching thin film transistor T is connected to the gate line 52 through the gate electrode Tg, to the data line 51 through the source electrode Ts, to the electrode storage plate 204 through the drain electrode Td. The switching thin film transistor T transmits a data voltage to the column parts 211 through the drain electrode Td and the electrode storage plate 204. The data voltage is input from the data line 51 when the first integrated circuit 311 is driven when the switching voltage is input to the gate electrode Tg from the gate line 52 from the second driving integrated circuit 321.

The storage capacitor Cs has a first storage plate 206 connected to the electrode storage plate 204 and a second storage plate 207 connected to the common electrode 205. The storage capacitor Cs stores a voltage corresponding to the difference between the voltage transmitted from the drain electrode Td of the switching thin film transistor T and the voltage supplied from the common electrode 205. This voltage is supplied to the column parts 211 of the shape memory polymer layer 201. As a result, the shape (e.g., height or size) of the column parts 211 are changed.

Since the shape of the column parts 211 change, the height of the column parts 211 are changed. As a result, the display panel 10 may be stably supported in the folding area FA when the display device is in both the folded and unfolded states. In one embodiment, the switching voltage input from the gate line 52 by driving the second driving integrated circuit 321 and the data voltage input from the data line 51 by driving the first driving integrated circuit 311 are set to correspond to one or more predetermined shapes of the column parts 211. The predetermined shapes may be determined, for example, based on experimentally acquired data or simulated data results.

The first substrate 221 of the support panel 20 includes the driver 203, the electrode storage plate 204, and the storage capacitor Cs. The shape memory polymer layer 201 is provided on the driver 203, the electrode storage plate 204, and the storage capacitor Cs. The second substrate 222 provided on a front surface is sealed by a sealant on the first substrate 221 with a gap to protect internal components from external impact or other influences.

The shape memory polymer layer 201 includes an inner plate 213 attached to the second substrate 222 and an outer plate 214 spaced apart from the outside of the inner plate 213 to be connected to the column part 211. The inner plate 213 is connected to the common electrode 205 and the outer plate 214 is connected to the electrode storage plate 204. Accordingly, the shape memory polymer layer 201 includes the inner plate 213 and the outer plate 214 at respective sides of the column part 211 formed in a structure connecting an H beam. For example, in the support panel 20, the inner plate 213 is at an adjacent side of the display panel 10 to receive compression force during a folding operation. The outer plate 214 receives tension during the folding operation.

Based on data of the compression force and the tension generated during the folding and unfolding operations (e.g., the column parts of the shape memory polymer layer may themselves output data or signals indicative of compressive or tensile stress, or data may be output from sensors that detect forces on the support panel and/or its control parts 211 and/or based on a folded, unfolded, or other state or orientation of the display device), the first driving integrated circuit 311 inputs the data voltage to the data line 51 and the second driving integrated circuit 321 inputs the switching voltage to the gate line 52. For example, when the display device is unfolded, the compression force of the inner plate 213 and the tension of the outer plate 214 are equally applied. In this case, the column parts 211 of the support panel 20 may be controlled to have the same height (see FIG. 2). Accordingly, the support panel 20 stably supports the folding area FA in the unfolded state and thus an unnecessary space is not formed at the rear side of the folding area FA of the display panel 10 when the display device is unfolded. Also, the support panel 20 resists the pressing force of a user's finger, a touch pen, or the like, to improve durability of the folding area FA.

The planar support parts 21 and 22 at respective sides of the folding area FA support the sides of the folding area FA of the unfolded display device. Accordingly, the display device may stably maintain a flat panel state by the support panel 20 and the planar support parts 21 and 22.

When the display device is folded, the compression force of the inner plate 213 and the tension of the outer plate 214 change. Among the column parts 211 of the support panel 20, the height of the column part 211 positioned at the center in the x-axial direction of the folding area FA may therefore be the smallest. The height of this column part 211 may be controlled (either alone or with adjacent column parts) to gradually increase toward the outside in the x-axial direction of the folding area FA (see FIG. 1). Accordingly, the support panel 20 may stably support the rear side of the folding area FA of the display panel 10 while the display device is folded.

The column parts 211 of the shape memory polymer layer 201 may be controlled to have the same state (e.g., height, shape, size, etc.) in the unfolded state. However, the size of each column part 211 may be controlled in the folded state based on the orientation of the folding area FA. As a result, the support panel 20 may support the folding area FA in both folded and unfolded states.

In one embodiment, the shape memory polymer layer 201 having the column parts 211 may be formed of shape memory polyurethane. The shape memory polyurethane may increase intermolecular interaction by introducing a rigid aromatic structure or by introducing molecules having a planar shape with a high shape memory effect.

In one embodiment, the shape memory polymer layer 201 is formed by the shape memory polymer using an electric property. The shape memory polymer using the electric property uses carbon nanotube (CNT) or carbon nanofiber (CNF) which is a nano filler in a polymer substrate to improve restoration performance for the folding operation.

The shape memory polymer may modify the shape to a stripe may improve thermal conductivity of polymer composites by filling an inorganic filler having thermal conductivity such as alumina, silica, silicon carbide (SiC), aluminum nitride (AlN), or boron nitride (BN) in the polymer substrate.

In accordance with one embodiment, an apparatus includes an interface coupled to a support panel of a display device, and a controller coupled to the interface. The controller generates signals to change a shape of the support panel to have a first shape in a folded state of the display device and to have a second shape in an unfolded state of the display device. The first shape is a non-planar shape and the support panel has an outer surface substantially coplanar with the first and second support surfaces when in the second shape.

The interface may receive signals indicative of forces and/or a state or orientation of the display panel, and/or may output the signals to change the shape of the support panel. The interface may take various forms. For example, when the controller is embodied within an integrated circuit chip, the output may be one or more output terminals, leads, wires, ports, signal lines, or other type of interface without or coupled to the driver. When the controller is embodied in software, the interface may be one or more instructions or blocks of code to receive and/or input information into other code for performing the operations of the controller. The controller generates the signals to control the shape of the support panel based on forces applied to the support panel in the folded and unfolded states. The support panel may be, for example, support panel 20 in accordance with any of the aforementioned embodiments.

The operations of the integrated driving circuits and the controllers and other control and processing features of the disclosed embodiments may be implemented in logic which, for example, may include hardware, software, or both. When implemented at least partially in hardware, the operations of the integrated driving circuits and the controllers and other control and processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the operations of the integrated driving circuits and the controllers and other control and processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Figure 8:
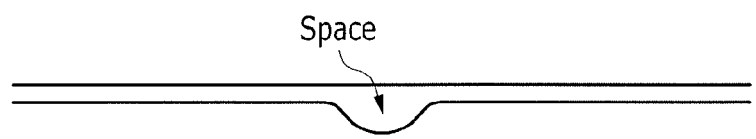
FIG. 8 illustrates an another type of flexible display device.

By way of summation and review, a flexible display device may be folded when not in use. In order to allow the flexible display device to be repeatedly folded and unfolded, a space is provided at an outer side (e.g., tensile side) of a folding area, as illustrated in FIG. 8. That is, the length of an arc at the outer side of the folding area is different from the length of an arc at an inner side (e.g., compression side) of the folding area. This difference in arc length forms a space which increases the thickness of the display device and may also irritate a user's hand. The space also prevents the folding from being supported, and thus the durability of the folding area may deteriorate when pressure is applied by a finger or touch pen.

In accordance with one or more embodiments, a flexible display device includes a flexible display panel displaying an image, a support panel including a shape memory polymer layer and a driver controlling a shape of the shape memory polymer layer to be provided on a rear side of the display panel, and a flexible PCB connecting the driver to a driving circuit board.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the invention as set forth in the following claims.

What is claimed is:
1. A flexible display device, comprising:
a flexible display panel to display an image;
a support panel including a shape memory polymer layer and a driver to control a shape of the shape memory polymer layer, the support panel coupled to a rear side of the display panel and the shape memory polymer layer in a folding area of the flexible display panel; and
a flexible PCB connecting the driver to a driving circuit board.
2. The flexible display device as claimed in claim 1, wherein:
the driver includes a switching thin film transistor to control a column part of the shape memory polymer layer,
the shape memory polymer layer is connected to an electrode storage plate and a common electrode connected to a drain electrode of the switching thin film transistor through the column part, and a shape of the shape memory polymer layer is adjusted based on a voltage corresponding to a difference between a voltage transmitted to the electrode storage plate from the switching thin film transistor and a voltage supplied from the common electrode.
3. The flexible display device as claimed in claim 2, wherein:
the driver includes a storage capacitor,
the switching thin film transistor is connected to a gate line and a data line to transmit a data voltage from the data line to the column part through the electrode storage plate based on a switching voltage input to the gate line, and
the storage capacitor is connected to the electrode storage plate through a first storage plate and is connected to the common electrode through a second storage plate to store the voltage corresponding to the difference between the voltage from the switching thin film transistor and the voltage supplied from the common electrode, the voltage to be supplied to the column part.
4. The flexible display device as claimed in claim 3, wherein:
the support panel includes a first substrate including the driver, the electrode storage plate, and the storage capacitor, and
a second substrate attached to the display panel and covering the shape memory polymer layer on the driver, the electrode storage plate, and the storage capacitor.
5. The flexible display device as claimed in claim 4, wherein:
the shape memory polymer layer includes an inner plate attached to the second substrate, and
an outer plate spaced apart from an outside of the inner plate and connected to the column part.
6. The flexible display device as claimed in claim 1, wherein:
the shape memory polymer layer includes a plurality of column parts,
the column parts of the support panel maintain substantially a same height while the display panel is unfolded, and
a height the column parts at a center of the folding area is less than a height of the column parts away from the center of the folding area while the display panel is folded.
7. The flexible display device as claimed in claim 1, wherein:
the shape memory polymer layer includes a plurality of column parts, and
the column parts are spaced apart from each other in a direction crossing a length direction of the folding area and extend in the length direction.
8. The flexible display device as claimed in claim 7, further comprising:
planar support parts attached to the rear side the display panel, the planar support parts adjacent respective sides of the folding area in substantially a same plane.
9. The flexible display device as claimed in claim 1, wherein:
the shape memory polymer layer includes a plurality of column parts,
a plurality of data lines extend in one direction of the display panel from one side of the column parts, the data lines substantially parallel to each other, and a plurality of gate lines extend in a direction crossing the data lines from one side of the column parts, the gate lines substantially parallel to each other.

10. The flexible display device as claimed in claim 9, wherein the flexible PCB includes:
   a first PCB including a first driving integrated circuit connected to the data line to apply a data voltage, and
   a second PCB including a second driving integrated circuit connected to the gate line to apply a switching voltage.

11. A display device, comprising:
   a control circuit;
   a first support surface;
   a second support surface; and
   a support panel in folding area between the first support surface and the second support surface, the control circuit to generate signals to change a shape of the support panel to have a first shape in a folded state and to have a second shape in an unfolded state, wherein the first shape is a non-planar shape and the support panel has an outer surface substantially coplanar with the first and second support surfaces when in the second shape.

12. The display device as claimed in claim 11, wherein the control circuit is to generate the signals based on forces applied to the support panel in the folded and unfolded states or a detected orientation or state of the display device.

13. The display device as claimed in claim 11, wherein the support panel includes one or more supports that are to expand and contract based on the signals generated by the control circuit.

14. The display device as claimed in claim 13, wherein the one or more supports are to expand and contract in a direction that crosses a display screen.

15. The display device as claimed in claim 11, wherein:
   the support panel includes a plurality of supports, and
   the signals generated by the control circuit are to cause the supports to have substantially a same size in the unfolded state and to have different sizes in the folded state.

16. The display device as claimed in claim 15, wherein the supports are included in a shape memory polymer layer.

17. The display device as claimed in claim 11, wherein the non-planar shape is a bent or curved shape.

18. An apparatus, comprising:
   an interface coupled to a support panel of a display device having first and second support surfaces, and
   a controller coupled to the interface, the controller to generate signals to change a shape of the support panel in a folding area of the display device to have a first shape in a folded state of the display device and to have a second shape in an unfolded state of the display device, wherein the first shape is a non-planar shape and the support panel has an outer surface substantially coplanar with the first and second support surfaces when in the second shape.

19. The apparatus as claimed in claim 18, wherein the controller is to generate the signals based on forces applied to the support panel in the folded and unfolded states.

* * * * *